United States Patent [19]

Bethmann

[11] Patent Number: 4,551,287

[45] Date of Patent: Nov. 5, 1985

[54] METHOD OF MAKING A HOLLOW-CHARGE INSERTS FOR ARMOR-PIERCING PROJECTILES

[75] Inventor: Karl W. Bethmann, Düsseldorf, Fed. Rep. of Germany

[73] Assignee: Rheinmetall GmbH, Düsseldorf, Fed. Rep. of Germany

[21] Appl. No.: 23,530

[22] Filed: Mar. 8, 1979

[30] Foreign Application Priority Data

Mar. 30, 1978 [DE] Fed. Rep. of Germany ....... 2813588

[51] Int. Cl.[4] ............................................. C06B 21/00
[52] U.S. Cl. ................................. 269/3 R; 264/3 C; 86/20 B; 102/307; 102/289
[58] Field of Search ............... 102/306, 309, 288, 289, 102/307; 86/20 B; 264/3 R, 3 C

[56] References Cited

U.S. PATENT DOCUMENTS

| | | | |
|---|---|---|---|
| 2,892,407 | 6/1959 | MacLeod | 102/309 |
| 3,140,659 | 7/1964 | Van Artsdalen et al. | 102/288 X |
| 3,316,842 | 5/1967 | Schulz | 102/288 |
| 3,494,286 | 2/1970 | Taylor | 102/288 |
| 3,779,819 | 12/1973 | Thomas et al. | 102/288 X |
| 3,802,342 | 4/1974 | Berlot et al. | 102/309 |
| 3,822,645 | 7/1974 | Alexander | 102/289 |
| 3,876,960 | 4/1975 | De Koker et al. | 102/306 X |
| 3,878,787 | 4/1975 | Lightstone et al. | 102/306 X |
| 4,094,248 | 6/1978 | Jacobson | 102/288 |

Primary Examiner—Peter A. Nelson
Attorney, Agent, or Firm—Karl F. Ross; Herbert Dubno

[57] ABSTRACT

Inserts for hollow charges, especially for armor-piercing projectiles, are formed with a monocrystalline, unitary structure by melting and directional solidification of a body of the insert material, e.g. copper, in which a shaping member has been provided.

12 Claims, 7 Drawing Figures

METHOD OF MAKING A HOLLOW-CHARGE INSERTS FOR ARMOR-PIERCING PROJECTILES

FIELD OF THE INVENTION

The present invention relates to hollow-charge (shaping) inserts for armor-piercing projectiles, to a material which can be used for this purpose, and to a method of making same.

BACKGROUND OF THE INVENTION

With armor-piercing weapons, the greatest destructive probability with the smallest number of firings is required. Between identical hollow-charge projectiles, only a limited difference in effect should be encountered. This requires the production of units with strict tolerances. This applies also to the geometry of the point-forming insert.

Even when substantially dimensionally identical hollow-charge projectiles are formed under substantially identical conditions, disadvantageously different effects are encountered. Investigations with hollow-charge inserts with good geometric congruence shown individual differences in a microscopic range, especially with respect to grain boundaries. To these differences, at least in part the disadvantageous deviations can be ascribed.

OBJECT OF THE INVENTION

The elimination of possible differences with dimensionally identical hollow-charge inserts is an object of the invention.

SUMMARY OF THE INVENTION

The object is attained by the use of monocrystalline solidified material for hollow-charge inserts, perferably in armor-piercing projectiles.

The invention has the advantage that grain boundaries with their sharply defined effects are eliminated as disturbing factors. In addition, the corrosion resistance of the hollow-charge inserts is improved. By cost comparison of armor-piercing projectiles with conventional hollow-charge inserts and those with hollow-charge inserts according to the invention, it must be considered that for a predetermined and predictable effect with the comparatively reduced number of projectiles of the latter type there is an advantageous penalty which is imposed upon an attacker of the locale in which the weapon is disposed.

The workpiece can be, for example, copper which has long been known in its polycrystalline form. It is especially good for monocrystalline solidification melting using crystalline growth processes, especially zone melting, Bridgman or Stockbarger processes each using a crucible or the crucible-free floating-zone process advantageously simultaneously with the separation of any minor quantities of impurities.

The monocrystalline material is anisotropic; these characteristics are advantageous in that a geometric axis of the hollow-charge insert fabricated therefrom, for example the rotation axis of a rotationally symmetrical configuration, can be oriented in a predetermined manner to a predetermined crystallographic direction.

For the production of, especially flat-conical, hollow charges, disks can be separated from a monocrystalline solidified copper bar, for example by an electro-erosive manner, which disks can be subjected to a deep-drawing, flow-pressing or other shaping process.

The invention also deals with a process for producing blanks of monocrystalline solidified material for pointed conical hollow-charge inserts without expensive shaping steps.

The process can comprise the following process steps:

(a) a predetermined stock volume, which extends along a growth axis, is melted and subjected to a directional solidification procedure, (b) in the solidification process, the temperature in the melt is so controlled that a phase boundary surface solid/liquid limiting a monocrystalline solidified region moves along the growth axis as a solidification front from a starting ordinate to an end ordinate associated with the termination of the solidification procedure, both ordinates lying along the growth axis, (c) in the path of the solidification front between a starting point and an end point there is arranged a shaped solid body extending along a body axis and with an outer surface which corresponds substantially with an inner surface of the blank such that the body axis coincides with the growth axis, whereby the starting point of the first is located between the starting and end ordinates and each cross section of the shaped solid body defines over a predetermined distance transverse to the growth axis a corresponding respective cross section of the stock volume, (d) in the operation of the solidification procedure, the starting point of the body axis forms a point of a solid/solid phase boundary surface between the shaped solid body and the monocrystalline solidified region which has a common edge with the solidification front and upon termination of the solidification procedure forms the inner surface of the blank, and (e) from the monocrystalline solidified blank-enclosing stock volume the shaped solid body is removed.

The melting and solidification can also be substantially simultaneously effected analogously, the material of the interior of the shaped solid body being the same material as that of the blank. Any seed monocrystal of a material corresponding to that of the blank can be used for initiating the monocrystalline solidification and the predetermined crystallographic directional axis of the seed monocrystal can include a predetermined angle (which can be zero) with the growth axis.

For removal of the shaped solid body a temperature profile is established transverse to the growth axis which includes in the region of the solid/solid phase boundary a respective steep temperature gradient. Also I can provide for an undercooling of the shaped solid body with respect to the surrounding monocrystalline blank or for the heating of the monocrystalline solidified blank with respect to the shaped solid body.

The copper, which can be used as the material, can be in the form of a powder and/or granulate with a predetermined particle-size distribution which can be compacted prior to melting.

The compaction of the copper powder and/or granulate can be carried out under a substantially oxygen-free atmosphere or in a predetermined vacuum and the compacted powder can be sintered.

The process can be effected by a crucible-free operation in which a heat source is moved along the growth axis and the workpiece volume with the shaped solid body associated therewith is held vertically.

Alternatively it can be effected with a melting vessel which is moved in the direction of the growth axis relative to a heat source with predetermined temperature gradient.

SPECIFIC DESCRIPTION

Figures 1, 2, 3, 4:
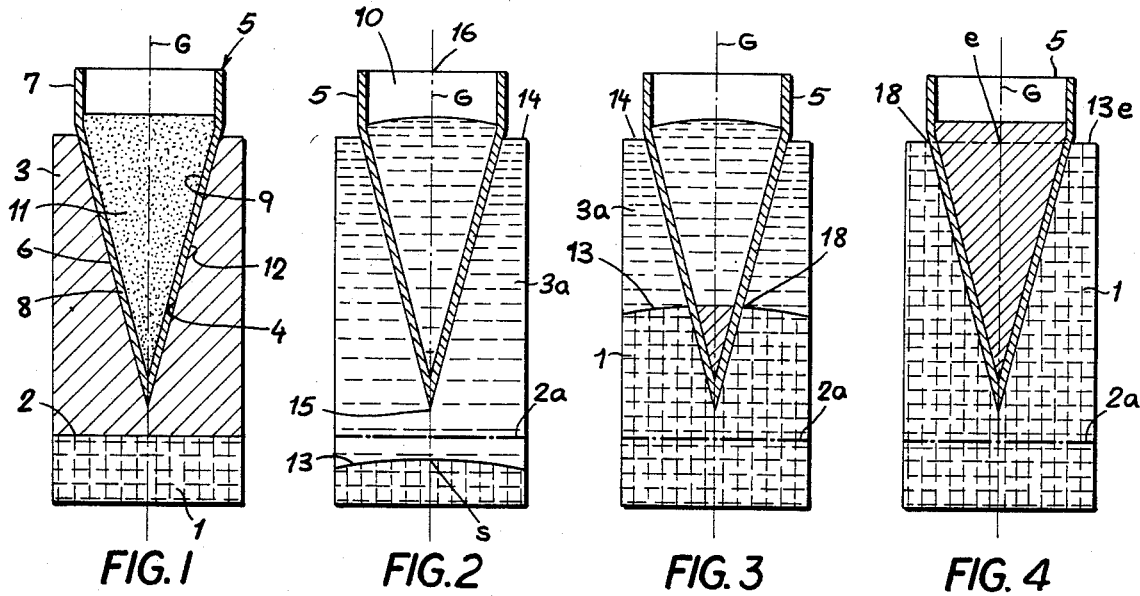
FIGS. 1 through 4, each in schematic form elminating details, show the development of the process in four different stages in side sections taken along along a growth axis.

FIG. 1 shows a seed monocrystal 1 of copper with a circular cross section having a contact surface 2 with an identical cross section bar 3 of polycrystalline copper serving as the starting material for a blank. The bar 3 has a pointed conical recess with a conical surface 4 serving to receive a shaped solid body 5 with a pointed conical portion 6 at its lower end and at whose upper end a circularly cylindrical portion 7 is connected. The part 7 serves to fix the shaped solid body 5 in a manner described further below. The shaped solid body 5 is provided with a wall 8 which, in the portion 6, has an inner surface surrounding a hollow space 10 filled with copper powder 11. The function of the copper powder 11 will be clarified in the further description process. The wall 8 of the shaped solid body 5 is composed of a metallic material which is insoluble in liquid copper and whose melting point is substantially above that of the copper; it can be tungsten. The inner surface 9 and outer surface 12 are of a high surface finish. The described arrangement has a growth axis G. It includes with the predetermined crystallographic axial direction of the seed monocrystal 1 an angle not shown. FIG. 1 shows the state before the smelting process by the use of a heat source not here shown.

FIG. 2 shows the arrangement of FIG. 1 after the smelting procedure. A dot-dash line 2a indicates the position of the contact surface 2 while 3a indicates a melt which extends from a solid/liquid phase boundary 13 with a starting ordinate s upon the growth axis G up to a melt surface 14 with an end ordinate e. A body axis intrinsic to the shaped solid body 5 and coinciding with growth axis G extends from a start 15 to an end 16. The start 15 lies between the ordinates s and e. As can be seen from the line 2a, the melt 3a extends over a predetermined volume of the seed crystal 1. By the relative movement between the described arrangement and the heat source, not shown, the solid/liquid phase boundary 13 moves as a solidification front along the growth axis G and reaches along its path the level seen in FIG. 3. It then lies above the start 15 of the body axis and has formed along the outer surface 12 a pointed conical solid/solid phase boundary 17 which has a common edge with the solidification front 13.

According to FIG. 4 the solidification front has, in the further execution of the procedure, reached the end ordinate e and formed the end face 13e of the blank, whereby the total volume of the melt 3a (FIG. 2) is monocrystalline hardened and represents a monocrystal 3e. The edge 18 lies at the level of the end ordinate e and bounds the complete surface 17 which forms an inner surface of the blank.

The monocrystal 3e is separated from the seed crystal 1, for example along 2a, so that the seed crystal is usable anew in the aforedescribed sense.

During the monocrystal growth a temperature gradient transverse to the growth axis should be avoided. To attain this result as far as possibe, with a reduced thickness of the wall 8, the hollow 10 of the shaped solid body 5 is filled with copper powder 11 and the latter is subjected to analogous procedures of smelting solidification as described previously. The massive copper body 11e (FIG. 4) resulting in the hollow 10 can be removed, in a further operation, yet to be developed in the description.

Figure 5:
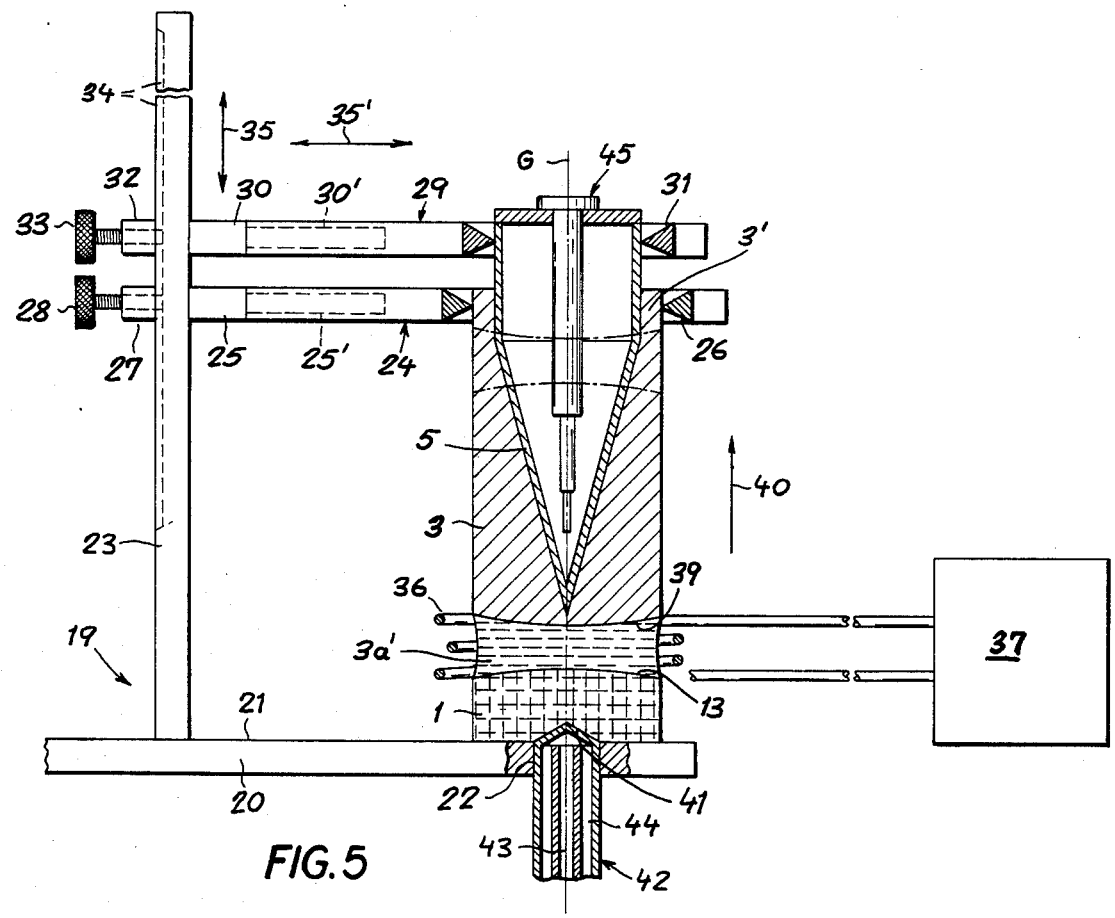
FIG. 5 is a first embodiment of the apparatus for crucible-free performance of the process in side elevation according to a section along the growth axis.

FIG. 5 shows a device for the crucible-free execution of the process.

The device includes a framework 19 with a horizontal support 20 and a resting surface 21 on the upper side thereof and an aperture 22. With predetermined horizontal spacing from the aperture 22, the support 20 carries a vertically arranged support bar 23 for the height-adjustable attachment of a bar holder 24 and a holder 29 arranged thereabove for the shaped solid body 5. The bar holder 24 includes a horizontal support arm 25 with a bar clamp 26 for the clamping of the upper end 3' of the bar 3. By means of an adjustment bushing 27 and a locking screw 28, the bar holder 24 can be releasably fixed to the support post 23 at a predetermined level. The holder 29 for the shaped solid body 5 includes a horizontal support arm 30 with a clamp 31 for the shaped solid body shown only schematically and similar to the bar clamp 26. The holder 29 is also releasably fixed in the direction of the double arrow 35 by means of an adjustment busing 32 and a locking screw 33 to the support post 23. A guide groove 34 in the support post 23 ensures parallel guidance of the two holders 24 and 29. Both support arms 25 and 30 permit, via respective telescoping guides 25' and 30' shown only schematically, respective length changes is the direction of the horizontal double arrow 35'. A high-frequency water-coolable coil 36 fabricated from a copper tube, of a high-frequency generator 37 shown only schematically, is arranged to be shiftable in the direction of the growth axis G. A cooling device 42 can be fixed in a manner not described further in the aperture 22 and will be developed in the further progress of this description.

The operation of the device according to FIG. 5 is as follows:

After disposing a seed monocrystal 1 in the high-frequency coil 36, the upper bar end 3' is fixed by means of the bar clamp 26 vertically and laterally. Thereafter, the shaped solid body 5 is disposed in the described manner in the conical surface 4 of the bar 3 and is similarly fixed vertically and laterally. A central body 45 to be described further below is inserted into the hollow chamber 10 which is then filled with copper powder 11. A central longitudinal axis Z of the central element 45, the body axis of the shaped solid body 5, and the growth axis G coincide with one another and include with the crystallographic axial direction of the seed monocrystal 1 a predetermined angle. By energization of the high-frequency generator 37 and as a result of the coupling of the power of the high-frequency coil 36, a smelting zone 3a' is generated which at its lower side is bounded by the solid/liquid phase boundary 13 and at its upper side by a liquid/solid phase boundary 39. The smelting zone 3a' has an extent in the direction of the growth axis G so designed that it is held intact by the surface tension of the melt. By movement of the high-frequency coil 36 in the direction of the arrow 40, the smelting zone 3a' migrates along the bar 3 until the solidification front 13 reaches the end ordinate e. At this point the directional solidification process is terminated and the high-frequency generator 37 is de-energized. To prevent radial breakdown of the smelting zone not only is the upper end 3' of the bar 3 retained in its original condition (it is separated at the level of the end ordinate e from the included monocrystal 3e), but the described process is also carried out in a vibration-free manner. The latter result is obtained by shifting the heat source represented by the high-frequency coil 36 while the seed monocrystal/bar arrangement is held stationary. As FIG. 5 shows, the seed monocrystal 1 has a conical recess 41. This serves for intimate contact therewith of the cooling arrangement 42 with a central water feed 43 and a concentrically surrounding water outlet 44. A heat abstraction (controllable in a manner not further described) in the direction of the growth axis G assures the problem-free monocrystalline solidification of the predetermined copper volume.

The bar 3 can be a polycrystalline copper solidified from a melt or can be composed of sintered copper. In this manner, the conical surface 4 can either be formed by chip-removal maching or, in the case of sintered copper, by a compaction of the starting material in a vibration process during which the conical surface is formed. With copper as well as with other materials, the sintering can be effected in vacuum or in a substantially oxygen-free protective gas atmosphere. The latter also applies for the smelting and solidification procedures for the production of the monocrystalline blank.

Figure 6:
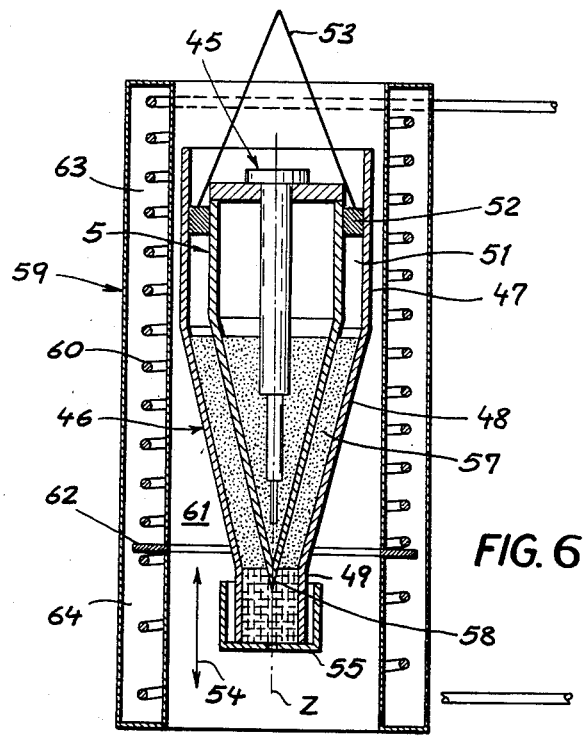
FIG. 6 is a second embodiment for carrying out the process with a melting vessel in side elevation according to a section along the growth axis.

FIG. 6 shows a device for carrying out the process in a furnace with the aid of a smelting vessel 46. The latter is composed preferably of quartz which enables observation of the process. The smelting vessel 46 includes an upper cylindrical portion 47 to which is connected a downwardly converging frustoconical region 48 with a cylindrical portion 49 of comparatively small diameter serving as a seed monocrystal receptacle. The smelting vessel 46 includes a wall 50 which encloses an inner space 51. In the upper portion 47 there is arranged an adjustable holder 42, shown only schematically and not further described, for the shaped solid body 5 enabling the radial and axial fixing thereof within the inner space 51. By means of a hanger 53, the smelting vessel 46 can be moved in the direction of a double arrow 54 with predetermined speed.

The circularly cylindrical portion 49 is connected to a bushing 55. It includes a support 56 for the seed monocrystal 1 and can be provided with an aperture 57, shown only schematically, for a cooling device as has been described described in conjunction with the device of FIG. 5. In executing the process with a smelting vessel it is advantageous to use a powder 57 of copper (or another corresponding material) of desired purity and with a predetermined particle size distribution. For the compaction of powder 57 the same condition is applied as those with the crucible-free process (FIG. 5). To prepare the process, the procedure is as follows:

The seed monocrystal 1 is fixed by means of the bushing 55 in a manner not shown in the circular cylindrical portion 49. Advantageously a centering recess 48 is provided in the upper region of the seed monocrystal for the shaped solid body 5. The latter (correspondingly filled and provided with the central element 45) is axially and radially adjusted and fixed by means the holder 52 so that its body axis coincides with the growth axis G. Then an inner space region 50' is filled with powder 57. The compaction can be effected by means of a vibrator not shown and acting upon the wall 51. The thus prepared smelting vessel is introduced via the hanger 53 in a diagrammatically shown furnace 59. The latter has a heating coil 60. This has an upper region 63 more tightly wound than the lower region 64 to generate a higher temperature. This provides a predetermined axial temperature gradient. To sharpen the temperature gradient, the region 63 and the region 64 are separated by a horizontally arranged baffle 62.

For the smelting, the smelting vessel 46, prepared as described above, is so introduced into the interior 61 of the furnace that the power transfer from the heating coil 60 to the seed monocrystal 1 forms the phase boundary surface 13 with the overlying melt 3a. By controlled lowering of the smelting vessel 46 in the furnace 59, the solidification front 13 migrates in the previously described manner along the growth axis G until it reaches the end ordinate e whereupon the process is terminated. In the previously described case immediately above, operations can also be carried out with a cooling device at the lower end of the seed monocrystal 1 and in vacuum or under a protective gas atmosphere.

In connection with a solidification process, the smelting vessel 46 can be discharged in a simple manner: after removal of the bushing 55 and with the application of a slight pressure to the underside of the seed monocrystal 1, the contents can be removed via the circularly cylindrical portion 47.

Figure 7:
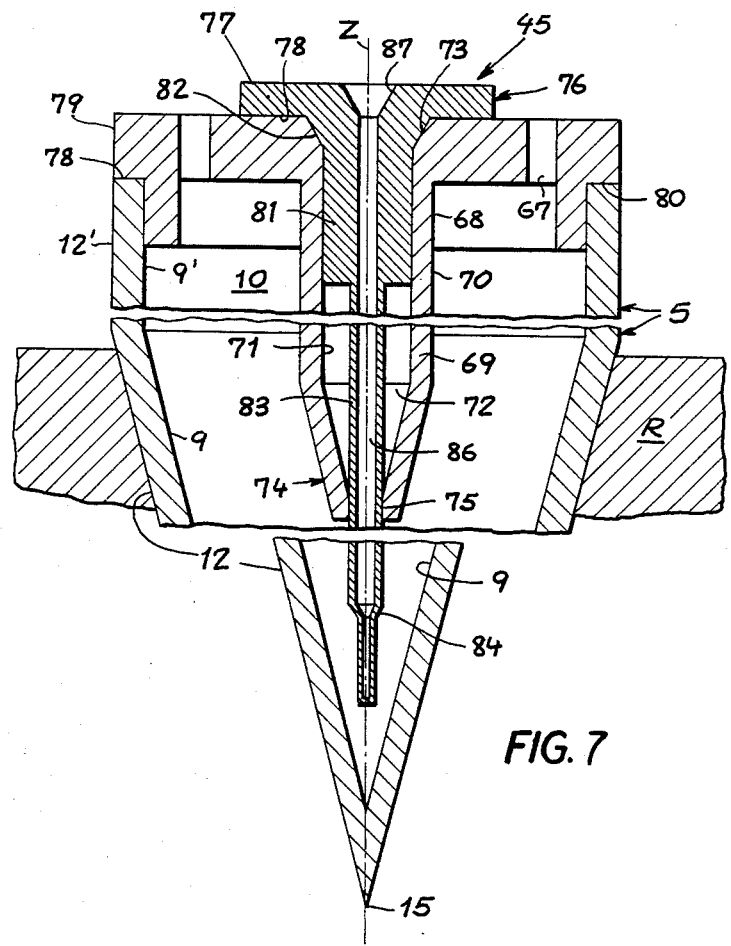
FIG. 7 is a shaped solid body according to the invention, without the details and as used in the preceding Figures, in a comparatively enlarged showing in side elevation according to a section along a central longitudinal axis.

FIG. 7 shows the shaped solid body 5 with the central element 45 whose central longitudinal axis Z coincides with the body axis not shown. It includes a cover-shaped carrier 65 with a centering projection 66 on its underside which reaches into the hollow space 10 and lies against the inner surface 9'. The carrier 65 has a throughgoing filling opening 67 (for example for copper powder) and on its underside a guide sleeve 68 of circular annular cross section with a wall 69; the outer surface 70 of the guide sleeve 68 is juxtaposed with the outer surfaces 9 and 9' and the inner surface 71 of the guide sleeve 68 encloses an inner space 72. The inner surface 71 opens at its upper end in a centering recess 73 and at its lower side in a frustoconical region 74 with a centering aperture 75 for an insert 76. The insert 76 includes a flange 77 conforming to the centering recess 73 with an underside 78 to rest upon the carrier 65 whose outer surface 79 is flush with the outer surface 12'. The underside 80 of the carrier 65, not further described, lies in contact with an end face 78 of the part 7. The flange 77 is extended by a countersurface 82 which merges with a centering piston 81 within the surface 71 and which encloses a reduced outer diameter tube 83. The tube with a lower portion fills the centering aperture 75 and terminates after a reducing step 84 in a hollow needle of circular cross section which is closed at its underside. An inner space surrounded by the tube 83 is in communication via the hollow conical recess 87 with the external atmosphere.

As already described, the hollow 10 of the shaped solid body 5 is filled with a powder of the material of the blank, for example copper, which is smelted during the process operation and hardens into a massive copper body. The selection of the material for the melt-contacting portions in the interior of the hollow 10 is made from the same viewpoint as the selection of materials for the shaped solid body 5. For removing the latter massive body from the interior space 10 and the shaped solid body 5 from the blank which is schematically shown in FIG. 7 at R, the inner space 86, in a manner not further described, is evacuated and filled with a cooling medium, for example liquid nitrogen. This allows the insert 73 to be removed without effort and leaves in the hardened copper a cavern. This is then evacuated and filled with the cooling medium, so that as a result of sufficient contraction both the shaped solid body 5 can be removed from the blank 3 and the copper body from the hollow 10. As a result of the radial temperature distribution observed during the process in conjunction with the analogous procedures in the hollow space (smelting and hardening), the conical surface 4 in the blank 3 with a corresponding surface finish of the outer surface 12 has good characteristics so that good machining processes are superfluous. A formation of the blank, for example material removable, to bring about the desired reduced wall thickness of the end product is facilitated advantageously by the configuration of the shaped solid body 5 in conjunction with the central element 45: the shaped solid body 5 is again inserted into the hollow cone with surface 4 and the centering recess 73 serves for mounting in the center of a turning machine. The aforedescribed process can be carried out in connection with the crucible-free method (see the description for FIG. 5) as well as the process technique with a smelting vessel (see the description for FIG. 6).

The process, in both of its forms, is readily carried out. While the crucible-free operation as a result of its higher power density in conjunction with a high-frequency coil requires less time, a blank made in the melting vessel requires a reduced material-removing machining because of the outer configuration imparted in the fustoconical region of the melting vessel.

I claim:

1. A method of making a charge insert for charge shaping in projectiles, comprising the steps of:
    (a) disposing a body of an insert-forming metal along a growth axis and inserting therein a rotationally symmetrical shaping member which is generally conical such that the axis of said shaping member lies substantially along said growth axis and commencing at a point inwardly from one end of said body, said member converging toward said point;
    (b) progressively melting said body from said one end thereof to said other end thereof and subjecting the melted portion to directional solidification with a directional solidification front progressively displaced along said growth axis from said one end of said body toward the other end thereof whereby said body is transformed into a monocrystalline structure having the shape of said insert; and
    (c) removing said member from said body, said member being removed from the monocrystalline body by cooling same below the temperature of said monocrystalline body or by heating said monocrystalline body relative to said member.

2. The method defined in claim 1 wherein a mass of insert-forming material is disposed within said member and said member is hollow to receive said mass, said mass being melted and directionally solidified upon movement of said solidification front along said growth axis within said member.

3. The method defined in claim 2 wherein said mass is composed of the same material as said body.

4. The method defined in claim 1, further comprising the step of disposing a seed monocrystal of the material of said body at said one end thereof and melting said seed monocrystal into said body and directionally solidifying said body from said monocrystal.

5. The method defined in claim 4 wherein said seed monocrystal has a crystallographic directional axis which includes a predetermined angle with said growh axis.

6. The method defined in claim 1 wherein said body is composed of copper.

7. The method defined in claim 1 wherein the body is formed by compacting a particulate.

8. The method defined in claim 7 wherein said particulate material is compacted in a substantially oxygen-free atmosphere.

9. The method defined in claim 8 wherein said particulate material is compacted under vacuum.

10. The method defined in claim 8 wherein the compacted material is sintered.

11. The method defined in claim 1 wherein the melting and directional solidification are carried out in a crucible-free operation in which a heat source is moved along the growth axis and said body and said member are held vertical.

12. The method defined in claim 1 wherein said body and said member are received in a melting vessel which is moved in the direction of the growth axis relative to a heat source with a predetermined temperature gradient.

* * * * *